(12) United States Patent　(10) Patent No.: US 11,257,562 B2
Tan　(45) Date of Patent: Feb. 22, 2022

(54) BUILT-IN-SELF-TEST CIRCUITS AND METHODS USING PIPELINE REGISTERS

(71) Applicant: Intel Corporation, Santa Clara, CA (US)

(72) Inventor: Tze Sin Tan, George Town (MY)

(73) Assignee: Intel Corporation, Santa Clara, CA (US)

( * ) Notice: Subject to any disclaimer, the term of this patent is extended or adjusted under 35 U.S.C. 154(b) by 844 days.

(21) Appl. No.: 15/909,562

(22) Filed: Mar. 1, 2018

(65) Prior Publication Data

US 2019/0043601 A1　Feb. 7, 2019

(51) Int. Cl.

| | |
|---|---|
| *G06F 11/10* | (2006.01) |
| *G06F 13/28* | (2006.01) |
| *G06F 11/30* | (2006.01) |
| *G06F 11/16* | (2006.01) |
| *G11C 29/16* | (2006.01) |
| *G11C 29/26* | (2006.01) |
| *G06F 11/27* | (2006.01) |
| *G01R 31/3177* | (2006.01) |
| *G11C 29/12* | (2006.01) |
| *G11C 29/32* | (2006.01) |
| *G11C 7/10* | (2006.01) |
| *G11C 8/16* | (2006.01) |
| *G11C 29/04* | (2006.01) |

(52) U.S. Cl.
CPC .......... *G11C 29/16* (2013.01); *G01R 31/3177* (2013.01); *G06F 11/27* (2013.01); *G11C 7/1039* (2013.01); *G11C 29/12015* (2013.01); *G11C 29/26* (2013.01); *G11C 29/32* (2013.01); *G11C 8/16* (2013.01); *G11C 2029/0401* (2013.01); *G11C 2029/1206* (2013.01)

(58) Field of Classification Search
CPC ............. G06F 11/27; G11C 2029/0401; G11C 7/1039; G11C 2029/1206; G11C 29/32; G11C 8/16; G11C 29/16; G11C 29/26; G11C 29/12015; G01R 31/3177
See application file for complete search history.

(56) References Cited

U.S. PATENT DOCUMENTS

| | | | |
|---|---|---|---|
| 7,475,315 B1 | 1/2009 | Natarajan et al. | |
| 7,707,472 B1 | 4/2010 | Dastidar | |
| 9,098,486 B1 | 8/2015 | Tan et al. | |
| 2002/0059543 A1* | 5/2002 | Cheng | G11C 29/16 714/30 |

(Continued)

*Primary Examiner* — Guy J Lamarre
(74) *Attorney, Agent, or Firm* — InventIQ Legal LLP; Steven J. Cahill

(57) ABSTRACT

An integrated circuit includes a built-in-self-test circuit that generates output test signals and a circuit tested by the built-in-self-test circuit. The circuit tested by the built-in-self-test circuit generates test results in response to the output test signals during a test. Pipeline register circuits are coupled together to form a signal path for transmitting the output test signals from the built-in-self-test circuit to the circuit tested by the built-in-self-test circuit. A functional circuit block is located in a reserved die area of the integrated circuit. The signal path is routed around the reserved die area to the circuit tested by the built-in-self-test circuit. At least a subset of the pipeline register circuits are located adjacent to at least two sides of the reserved die area.

21 Claims, 5 Drawing Sheets

(56) References Cited

U.S. PATENT DOCUMENTS

| | | | | |
|---|---|---|---|---|
| 2005/0066247 A1* | 3/2005 | Cheng | ............. | G11C 29/50 |
| | | | | 714/733 |
| 2005/0193293 A1* | 9/2005 | Shikata | ............. | G11C 29/14 |
| | | | | 714/718 |
| 2008/0059850 A1* | 3/2008 | Bahl | ............. | G06F 11/27 |
| | | | | 714/718 |
| 2013/0080847 A1* | 3/2013 | Zorian | ............. | G06F 30/39 |
| | | | | 714/718 |
| 2017/0328951 A1* | 11/2017 | Liew | ............. | G01R 31/3177 |

* cited by examiner

BUILT-IN-SELF-TEST CIRCUITS AND METHODS USING PIPELINE REGISTERS

FIELD OF THE DISCLOSURE

The present disclosure relates to electronic circuits, and more particularly, to built-in-self-test circuits and methods using pipeline register circuits.

BACKGROUND

Memory blocks are often fabricated as part of modern integrated circuits. For example, application-specific integrated circuits and programmable integrated circuits such as programmable logic device (PLD) integrated circuits may contain memory blocks. Memory blocks may be provided as arrays of random-access memory (RAM) cells. The memory blocks are used to handle the storage needs of the circuitry on a given integrated circuit. During normal operation of the integrated circuit, read and write operations are performed on the memory blocks.

To ensure satisfactory operation of an integrated circuit that contains memory blocks, the memory blocks are usually tested during debug and design operations. Testing may also be performed during manufacturing. It can be cumbersome or impossible to perform high-speed memory tests using only external test equipment. It is therefore often desirable to include internal test support circuitry on an integrated circuit to facilitate memory block tests. Because the internal test circuitry is incorporated into the integrated circuit that is to be tested, this type of test circuitry is sometimes referred to as built-in-self-test (BIST) circuitry.

A BIST circuit can supply a memory block with test data while systematically stepping through the addresses for the memory block. If an unexpected result is detected in response to certain test data, the BIST circuit can conclude that the memory block contains an error. Appropriate debugging or manufacturing repair operations may then be performed. Pipeline registers may be inserted between the BIST circuit and the memory block using manual analysis to reduce signal transit time at identified critical paths. This technique involves register-transfer level (RTL) modification. Alternatively, BIST circuits can be placed near memory blocks in an integrated circuit in an attempt to meet timing requirements during synthesis.

DETAILED DESCRIPTION

Built-in-self-test (BIST) circuits are typically inserted in the design phase of an integrated circuit to enable high volume manufacturing (HVM) tests for memory blocks in the integrated circuit. To achieve high quality test coverage, BIST circuits are optimized to operate at full clock speed. However, the floor plan of an integrated circuit (IC) is usually locked down before BIST circuits are inserted into the design of the IC. The ability to run at high performance depends on signal transit setup time, which translates to physical distance in between the BIST and the circuits being tested on the IC. With the IC design floor plan fixed prior to BIST circuit insertion, placement of BIST circuits in the IC is restrictive, which limits achievable BIST circuit performance.

According to some embodiments, the floor plan of an IC is made available to a BIST insertion tool. The BIST insertion tool uses the floor plan of the IC to insert pipeline register circuits at strategic locations in the IC to achieve high BIST performance. The pipeline registers are inserted into the IC based on the physical distance between the BIST circuit and the circuits tested by the BIST circuit. If there are circuit blocks in the IC that have reserved IC die area, signal paths between the BIST circuit and the circuit tested by the BIST circuit are routed around the circuit blocks.

Figure 1A:
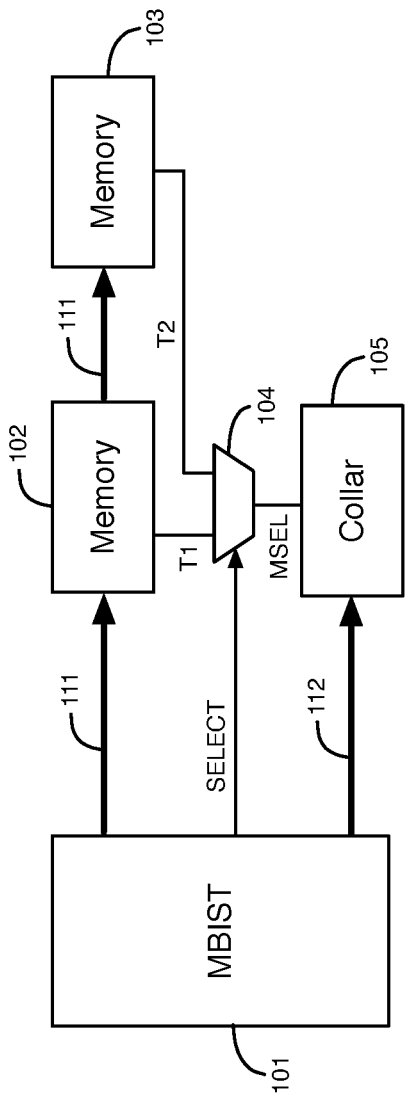
FIGS. 1A-1B illustrate a test system used to perform a built-in-self-test (BIST) of memory circuit blocks in an integrated circuit, according to an embodiment.
Figure 1B:
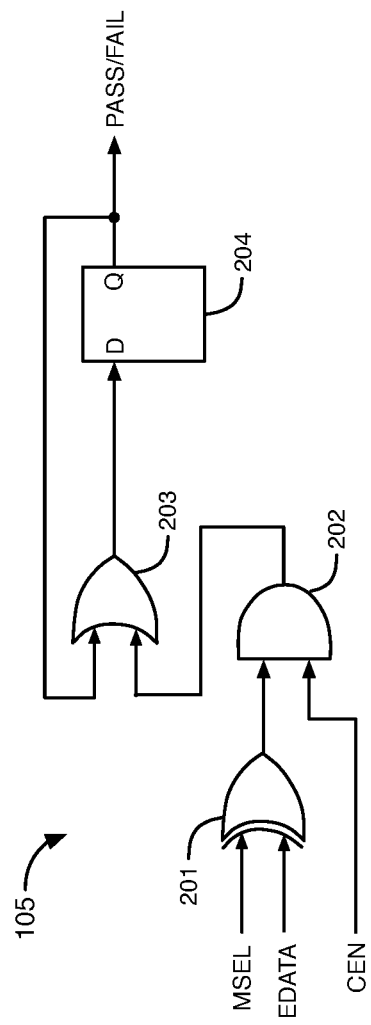

FIGS. 1A-1B illustrate a test system used to perform a built-in-self-test (BIST) of memory circuit blocks in an integrated circuit, according to an embodiment. Figure (FIG. 1A illustrates a memory BIST (MBIST) circuit 101, memory circuit blocks 102-103, a multiplexer circuit 104, a collar circuit 105, and busses 111-112. Collar circuit 105 is used to compare the outputs of the memory circuit block 102 or 103 to expected data to determine if the tested memory circuit block 102 or 103 passed or failed the test.

MBIST circuit 101 provides test stimuli, including for example, address bits, test write data, a write enable signal, and a read enable signal, to the memory circuit blocks 102-103 that are being tested through bus 111. MBIST circuit 101 may, for example, use any testing algorithm, such as the March memory testing algorithm, to test memory circuit blocks 102-103. The signals carrying the test stimuli are transmitted from MBIST circuit 101 to one or both of memory circuit blocks 102-103 through bus 111, as shown in FIG. 1A. The test stimuli are then stored in register circuits within memory circuit blocks 102-103. The test stimuli are used to test memory circuit blocks 102-103. Memory circuit blocks 102 and 103 generate test result output signals T1 and T2, respectively, in response to the test stimuli.

Output signals T1 and T2 are transmitted to inputs of multiplexer circuit 104. MBIST circuit 101 generates a SELECT signal that is transmitted to the select input of multiplexer circuit 104 and that controls the selections of multiplexer circuit 104. MBIST circuit 101 determines which of the test result output signals T1 or T2 that multiplexer circuit 104 transmits to collar circuit 105 as selected signal MSEL by setting the logic state of the SELECT signal. MBIST circuit 101 transmits expected data EDATA and a compare enable signal CEN to collar circuit 105 through bus 112.

FIG. 1B illustrates further details of an example of collar circuit 105. Collar circuit 105 is part of a response analyzer. As shown in FIG. 1B, collar circuit 105 includes XOR logic gate circuit 201, AND logic gate circuit 202, OR logic gate circuit 203, and register circuit 204. The expected data EDATA and the test result output signal MSEL of memory circuit block 102 or 103 are transmitted to inputs of XOR gate circuit 201. The output signal of XOR gate circuit 201 and the compare enable signal CEN are transmitted to inputs of AND gate circuit 202. Register circuit 204 generates a PASS/FAIL signal at its Q output. The PASS/FAIL signal is provided to one input of OR logic gate circuit 203 and propagated to an external tester as a GO/NO-GO test result. The output signal of AND logic gate 202 is provided to another input of OR logic gate 203. The output signal of OR logic gate 203 is provided to the D input of register circuit 204.

If the test result output signal MSEL has the same logic state as the expected data EDATA, and the CEN signal is a logic 1, then a logic 0 is generated by XOR gate 201, transmitted through AND logic gate 202 and OR logic gate 203, and then stored at the Q output of register circuit 204 as the PASS/FAIL signal, indicating the tested memory circuit block passed the test. If the test result output signal MSEL has a different logic state than the expected data EDATA, and the CEN signal is a logic 1, then a logic 1 is generated by XOR gate 201, transmitted through AND logic gate 202 and OR logic gate 203, and then stored at the Q output of register circuit 204 as the PASS/FAIL signal, indicating the tested memory circuit block failed the test. After the PASS/FAIL signal transitions to a logic 1, the PASS/FAIL signal remains as a logic 1 until register circuit 204 is cleared.

Figure 2:
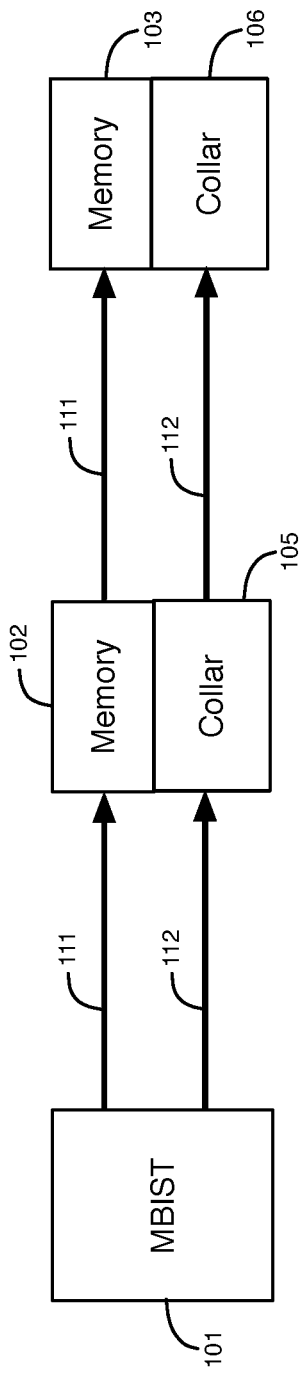
FIG. 2 illustrates another test system used to perform built-in-self-test (BIST) of memory circuit blocks in an integrated circuit, according to another embodiment.

FIG. 2 illustrates another test system used to perform built-in-self-test (BIST) of memory circuit blocks in an integrated circuit, according to another embodiment. In the embodiment of FIG. 2, each tested memory circuit block has an associated collar circuit. FIG. 2 may be generated from the test system of FIG. 1A by assigning a collar circuit to each tested memory circuit block using a local response analyzer.

FIG. 2 illustrates memory BIST (MBIST) circuit 101, memory circuit blocks 102-103, collar circuits 105-106, and busses 111-112. MBIST circuit 101 provides test stimuli to memory circuit blocks 102-103 through bus 111, as described above with respect to FIG. 1A. Collar circuits 105 and 106 compare test results output by memory circuit blocks 102 and 103, respectively, to expected data received from MBIST circuit 101 through bus 112, as described above with respect to FIG. 1B.

Figure 3:
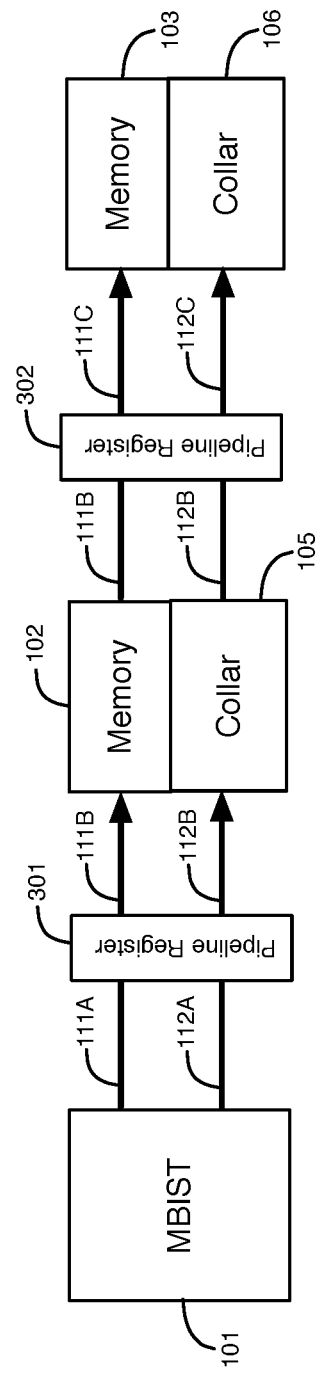
FIG. 3 illustrates an example of the test system of FIG. 2 after pipeline registers have been inserted into the signal paths between an MBIST circuit and tested memory circuit blocks, according to an embodiment.

If the signal transmit time through bus 111 from MBIST circuit 101 to one or more of the tested memory circuit blocks 102-103 is greater than a maximum value, pipeline register circuits are inserted into the signal paths in busses 111-112 to reduce the register-to-register timing delays. FIG. 3 illustrates an example of the test system of FIG. 2 after pipelined registers have been inserted into the signal paths between the MBIST circuit 101 and the tested memory circuit blocks 102-103, according to an embodiment.

In the embodiment of FIG. 3, pipeline register circuits 301 are inserted into bus 111 on the signal paths between MBIST circuit 101 and memory circuit block 102. Pipeline register circuits 301 are also inserted into bus 112 on the signal paths between MBIST circuit 101 and collar circuit 105. Pipeline register circuits 301 divide busses 111 and 112 into segments 111A-111B and 112A-112B, respectively. Each of the bus segments 111A and 111B has a shorter length than bus 111 in FIG. 2, and each of the bus segments 112A and 112B has a shorter length than bus 112 in FIG. 2. Dividing bus 111 into bus segments 111A-111B reduces the register-to-register timing delays of the signals carrying the test stimuli between MBIST circuit 101 and memory circuit block 102. Dividing bus 112 into bus segments 112A-112B reduces the register-to-register timing delays of the expected data and compare enable signal between MBIST circuit 101 and collar circuit 105.

Also, in the embodiment of FIG. 3, pipeline register circuits 302 are inserted into bus 111 on the signal paths between MBIST circuit 101 and memory circuit block 103. Pipeline register circuits 302 are also inserted into bus 112 on the signal paths between MBIST circuit 101 and collar circuit 106. Pipeline register circuits 302 divide busses 111-112 into segments 111B-111C and 112B-112C, respectively. Bus segments 111B shown on either side of memory circuit block 102 are coupled together, although the coupling is not shown in FIG. 3. Bus segments 112B shown on either side of collar circuit 105 are coupled together, although the coupling is not shown in FIG. 3. Dividing bus 111 into 3 bus segments 111A-111C reduces the register-to-register timing delays of the test stimuli between MBIST circuit 101 and memory circuit block 103. Dividing bus 112 into 3 bus segments 112A-112C reduces the register-to-register timing delays of the expected data and compare enable signal between MBIST circuit 101 and collar circuit 106.

The pipeline registers 301-302 add extra latency to the signal paths through busses 111-112. However, the extra latency does not adversely affect the operation of the test system, because the results of the tests are stored in a response analyzer circuit that is monitored at the end of the tests. The PASS/FAIL signals may be transmitted to MBIST 101 for eventual propagation to an external tester at a much lower frequency than the test stimuli through different signal paths than the test stimuli.

Figure 4:
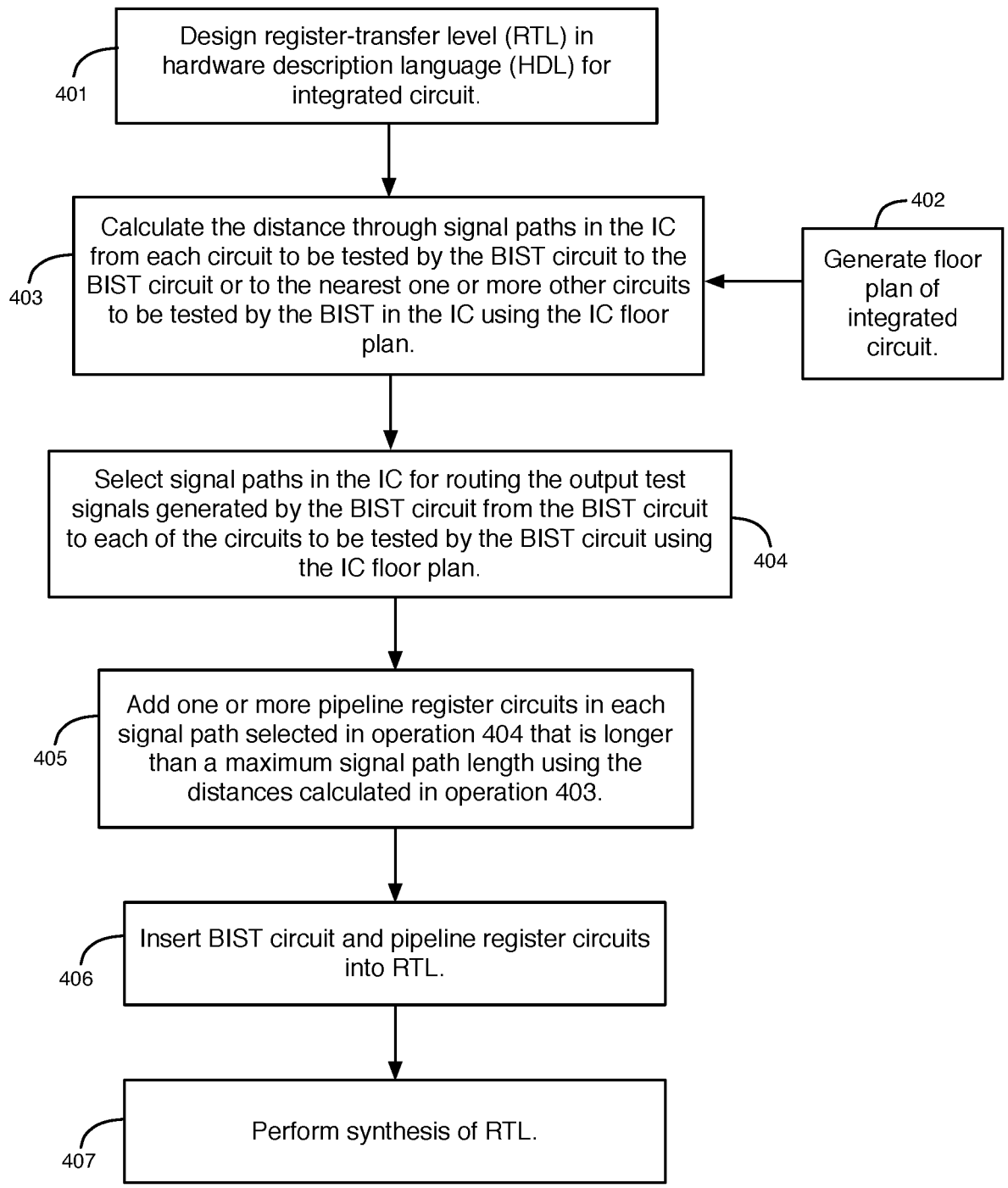
FIG. 4 is a flow chart that illustrates examples of operations that can be performed to place pipeline register circuits in the signal paths between a built-in-self-test (BIST) circuit and the circuits to be tested by the BIST circuit, according to an embodiment.

FIG. 4 is a flow chart that illustrates examples of operations that can be performed to place pipeline register circuits in the signal paths between a built-in-self-test (BIST) circuit and the circuits to be tested by the BIST circuit, according to an embodiment. The operations of FIG. 4 can be used to place pipeline registers between any type of BIST circuit and any types of circuits that are to be tested by the BIST circuit. As an example, the BIST circuit may be an MBIST circuit, and the circuits to be tested may be memory circuits, as disclosed herein with respect to FIGS. 1A-3. The BIST circuit and the circuits to be tested by the BIST circuit are in one integrated circuit (IC) die. The IC may be a programmable logic integrated circuit, a processor integrated circuit, a graphics processing unit (GPU) integrated circuit, a memory integrated circuit, or another type of IC.

In operation 401 shown in FIG. 4, a register-transfer level (RTL) is designed in a hardware description language (HDL) for the integrated circuit (IC). The RTL is a design abstraction that models digital circuits in the IC in terms of the flow of digital signals between register circuits in the IC and the logical operations performed on the digital signals.

In operation 402, a floor plan of the integrated circuit (IC) is generated. The IC floor plan is a schematic representation of the tentative placement of functional circuit blocks within the IC. The IC floor plan includes placement information that indicates the exact assigned locations for circuit blocks within the IC's core area. The placement information may include the location of the BIST circuit and the locations of the circuits to be tested by the BIST circuit within the IC's core area, as well as the locations of other functional circuit blocks in the IC. In some embodiments, the locations of the circuits to be tested by the BIST circuit within the IC floor plan may be determined before the locations of the BIST circuit and other BIST circuits within the IC are determined.

In operation 403, a design tool calculates the distance(s) through one or more signal paths in the IC from each circuit to be tested by the BIST circuit to the BIST circuit (or to the nearest one or more other circuits to be tested by the BIST circuit in the IC) using the IC floor plan. The design tool may use the placement information to calculate these distances. For example, the design tool may calculate the distance through signal paths in the IC from the BIST circuit to a first circuit to be tested by the BIST circuit using the IC floor plan. As another example, the design tool may calculate the distance through signal paths in the IC from the first circuit to be tested by the BIST circuit to a second circuit to be tested by the BIST circuit using the IC floor plan. As yet another example, the design tool may calculate the distance through signal paths in the IC from the first circuit to be tested by the BIST circuit to second and third circuits to be tested by the BIST circuit using the IC floor plan. As still another example, the design tool may calculate the distance through signal paths in the IC from the BIST circuit to each of first, second, and third circuits to be tested by the BIST circuit using the IC floor plan.

In operation 404, the design tool selects signal paths in the IC for routing the output test signals generated by the BIST circuit from the BIST circuit to each of the circuits to be tested by the BIST circuit using the IC floor plan. The design tool may use the placement information to select these signal paths. The design tool may select signal paths in the IC between the BIST circuit and the circuits to be tested by the BIST circuit that are as short as possible, according to IC design constraints. The design tool may also, or alternatively, select signal paths in operation 404 that route around functional circuit blocks in the user design for the IC using the placement information for the functional circuit blocks. The output test signals of the BIST circuit may include, for example, test stimuli, expected data, and compare enable signals, as discussed above, for example, with respect to MBIST for memory circuits. The signal paths selected in operation 404 may, for example, include one or more busses. The signal paths selected in operation 404 may, for example, be used during place and route when all of the signal paths used in the IC are routed through wires in the IC.

In operation 405, the design tool adds one or more pipeline register circuits in each signal path selected in operation 404 that is longer than a maximum signal path length using the distance(s) calculated in operation 403. The design tool analyzes the IC floor plan to determine how many pipeline register circuits to place in each signal path selected in operation 404. The design tool also analyzes the IC floor plan in detail to determine where in each signal path selected in operation 404 to place the pipeline register circuits. The design tool places the pipeline register circuits into the signal paths to cause each signal path between any two adjacent pipeline register circuits to be less than or equal to the maximum signal path length.

The maximum signal path length for each signal path is determined based on the frequencies of the signals transmitted through that signal path and based on set-up times of the register circuits receiving the signals. As an example, the maximum signal path length of a signal path may be less than the unit interval of bits that are transmitted through the signal path. The maximum signal path length for each signal path is shorter if higher frequency signals are transmitted through the signal path and longer if lower frequency signals are transmitted through the signal path. A sufficient number of pipeline register circuits can be placed into each signal path carrying output test signals from a BIST circuit to allow the output test signals to be provided to the circuits to be tested by the BIST circuit at the full clock signal frequency of the IC, which allows the tests to mimic normal IC operation.

The number of pipeline register circuits inserted into one of the signal paths is determined based on the length of the signal path between the BIST circuit and the circuit tested by the BIST circuit and based on the maximum signal path length. The minimum number N of pipeline register circuits that the design tool inserts in each signal path is determined as follows. The length of the signal path is divided by the maximum signal path length to calculate a quotient Q. One is then subtracted from the truncated quotient Q of this division to get the number N of pipeline registers inserted in the signal path. For example, referring to FIG. 3, two pipeline register circuits 301-302 are added into the signal path 111A-111C if the signal path 111A-111C is three times the maximum signal path length. The pipeline register circuits can be placed into numerous signal paths that provide test signals from a BIST circuit to achieve signal timing constraints without placing the BIST circuit near the circuits to be tested by the BIST circuit.

The addition of the pipeline register circuits in the signal paths increases the latency of the test output signals transmitted from the BIST circuit to the circuits tested by the BIST circuit. However, the increased latency does not adversely affect test operation, because the results of the tests are stored in a response analyzer that is monitored at the end of the tests after the output test signals of the BIST circuit have propagated to the most distant circuit to be tested.

An example of pseudo-code for the operations 403-405 is now provided. For every circuit to be tested by a BIST, calculate its distance to a few nearest circuits to be tested by the BIST or to a BIST circuit, then source BIST output test signals from the nearest neighboring BIST circuit. If the source register circuit is farther away than the maximum signal path length, one or more pipeline register circuits are added at intervals in the signal path, such that the distance between any two adjacent register circuits in the signal path is less than or equal to the maximum signal path length. The BIST circuit and the circuits to be tested also have register circuits, and therefore, the BIST circuit and the circuits to be tested count as register circuits in this analysis.

In operation 406, the design tool inserts the BIST circuit and the pipeline register circuits added in operation 405 into the RTL for the integrated circuit (IC). The design tool may also insert additional BIST circuits and additional pipeline register circuits generated for the additional BIST circuits in operation 405 into the RTL. In operation 407, a synthesis tool performs logic synthesis of the RTL for the IC generated in operation 406. During logic synthesis, the design abstraction that models the digital circuits in the IC at the register transfer level (RTL) is converted to a design implementation of logic gates and registers.

According to some embodiments, a likely placement of the BIST circuit in the IC is initially determined (e.g., in operation 401), although the placement may not be fixed initially. During operation 403, the likely BIST circuit placement previously determined is presumed although it may not be fixed. After operation 406, the RLT is processed using synthesis, placement, and routing techniques to finalize the placement of the BIST circuit. If the initial placement of the BIST circuit used in operation 403 is substantially different than the final placement of the BIST circuit, an additional iteration of operations 403-407 may be performed to generate more accurate results for the placement of the signal paths and the pipeline register circuits.

Figure 5:
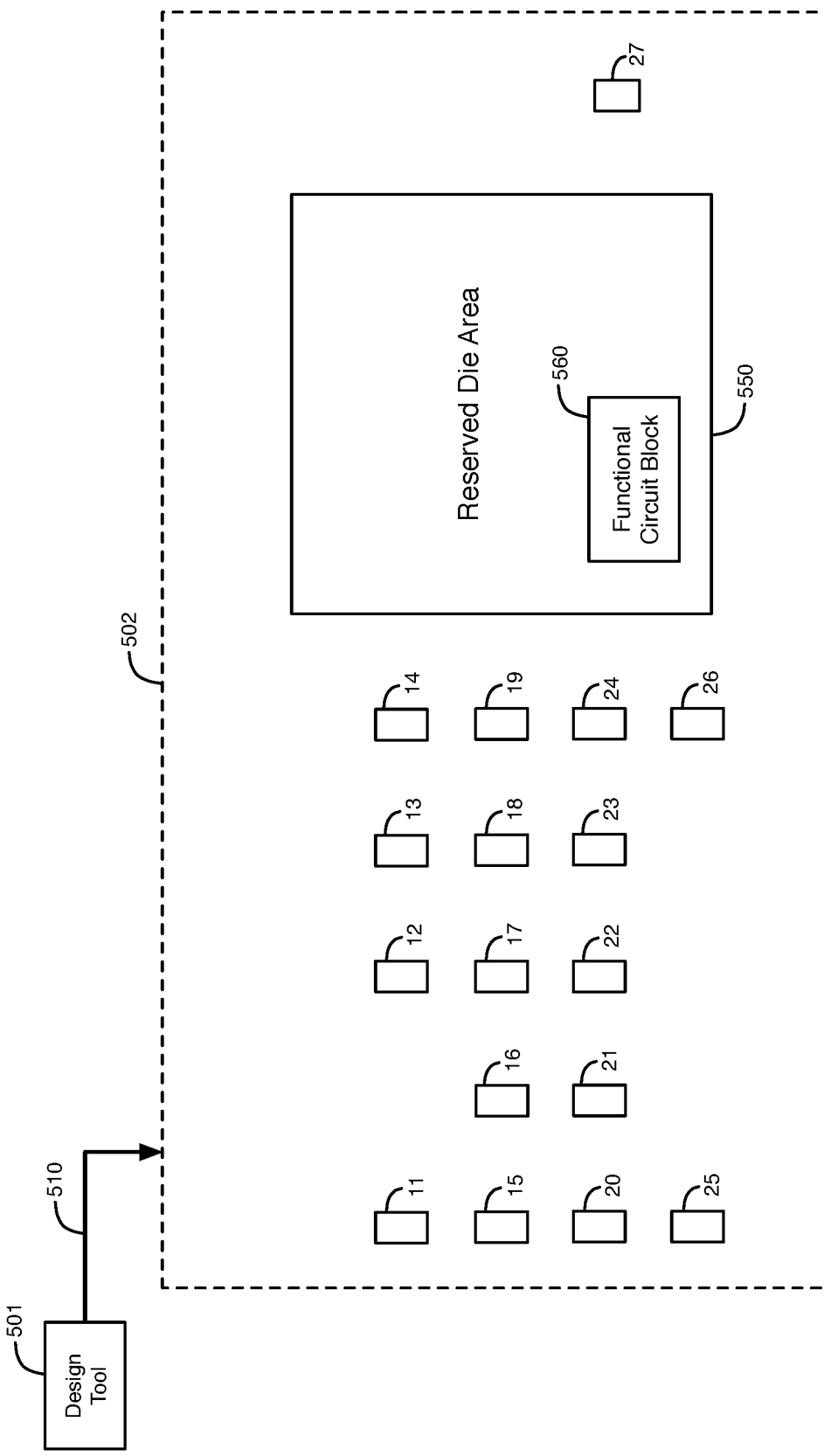
FIG. 5 illustrates a design tool and an integrated circuit (IC) die that has circuits to be tested by a BIST circuit and a reserved die area, according to an embodiment.
Figure 6:
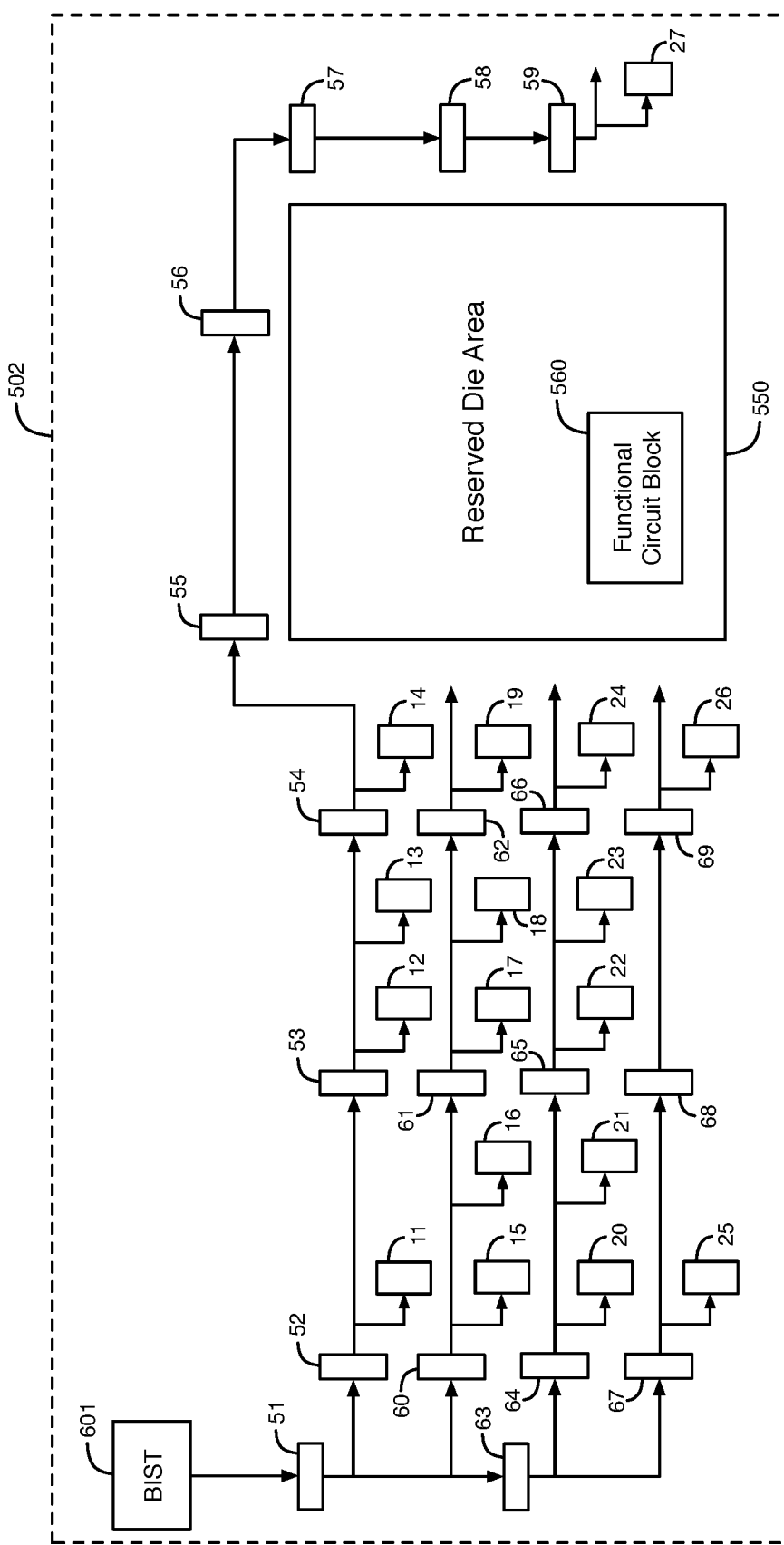
FIG. 6 illustrates the IC die of FIG. 5 after a BIST circuit and pipeline register circuits have been inserted into signal paths between the BIST circuit and the circuits to be tested by the BIST circuit, according to an embodiment.

FIGS. 5-6 illustrate an example of how the operations disclosed herein with respect to FIG. 4 can be used to place pipeline register circuits in the signal paths between a built-in-self-test (BIST) circuit and the circuits to be tested by the BIST circuit, according to an embodiment. FIG. 5 illustrates a design tool 501 and an integrated circuit (IC) die 502 that has circuits to be tested 11-27 by a BIST circuit and a reserved die area 550, according to an embodiment. The circuits 11-27 may be any types of circuits that can be tested by a BIST circuit that is on the same IC die. As an example, circuits 11-27 may be arrays of memory circuits, and the BIST circuit may be an MBIST circuit.

Design tool 501 is an example of the design tool disclosed herein with respect to FIG. 4. Design tool 501 may, for example, be implemented on a computer that is physically separate from IC die 502. The computer may include a non-transitory storage medium. Design tool 501 generates the information discussed above with respect to FIG. 4 and transmits that information to IC 502 through bus 510. Reserved die area 550 is a region of IC die 502 that is reserved for one or more functional circuit blocks in the user design for IC 502, such as functional circuit block 560. During placement, the one or more functional circuit blocks are placed within logic circuitry in the reserved die area 550. Reserved die area 550 may or may not include BIST circuits or circuits to be tested by a BIST circuit.

Only a portion of IC die 502 is shown in FIGS. 5-6. IC die 502 may include numerous other circuits in addition to the circuits shown in FIGS. 5-6, such as additional reserved die areas for other functional logic circuit blocks, additional circuits to be tested by BIST circuits, transceiver circuits, circuits for generating and transmitting clock signals, logic circuitry, memory circuits, wires, and other types of circuits.

FIG. 6 illustrates IC die 502 after a BIST circuit 601 and pipeline register circuits 51-69 have been placed into signal paths between BIST circuit 601 and circuits 11-27 using operations of FIG. 4, according to an embodiment. In the embodiment of FIG. 6, circuits 11-27 are tested by BIST circuit 601. The pipeline register circuits 51-69 are inserted into signal paths from BIST circuit 601 to the circuits 11-27 to be tested by the BIST circuit 601, as shown in FIG. 6, using operations 403-406 of FIG. 4. The arrows in the signal paths shown in FIG. 6 include conductors.

As described herein with respect to FIG. 4, the design tool 501 may place 1 or more pipeline register circuits between the BIST circuit and each circuit to be tested by the BIST circuit. For example, the design tool 501 places pipeline register circuits 51 and 52 in the signal path between BIST circuit 601 and circuit 11, as shown in FIG. 6. In this example, output test signals from BIST circuit 601 are transmitted through register circuits 51-52 to circuit 11. As another example, the design tool 501 places pipeline register circuits 51-53 between BIST circuit 601 and circuits 12-13. In this example, output test signals from BIST circuit 601 are transmitted through register circuits 51-53 to circuits 12-13. As yet another example, the design tool 501 places pipeline register circuits 51-54 between BIST circuit 601 and circuit 14. In this example, output test signals from BIST circuit 601 are transmitted through register circuits 51-54 to circuit 14.

A signal path between a BIST circuit and a circuit to be tested by the BIST circuit may also be routed around a die area of the IC that is reserved for one or more functional circuit blocks in a user design for the IC. As shown for example in FIG. 6, the signal path between BIST circuit 601 and circuit 27 is routed around reserved die area 550 through pipeline register circuits 51-59. In this example, output test signals from BIST circuit 601 are transmitted through register circuits 51-59 to circuit 27. Pipeline register circuits 55-59 are routed around reserved die area 550 by being placed adjacent to two sides of reserved die area 550. In some embodiments, pipeline register circuits that route output test signals from a BIST circuit may be placed adjacent to three sides of a functional circuit block in a reserved die area to route around the reserved die area.

In the example of FIG. 6, the output test signals of BIST circuit 601 are provided through different signal paths. One signal path is routed from BIST circuit 601 through registers 51-59 to circuits 11-14 and 27. Another signal path is routed from BIST circuit 601 through registers 51 and 60-62 to circuits 15-19. Another signal path is routed from BIST circuit 601 through registers 51 and 63-66 to circuits 20-24. Yet another signal path is routed from BIST circuit 601 through registers 51, 63, and 67-69 to circuits 25-26.

The design tool 501 places the pipeline register circuits 51-69 into the signal paths shown in FIG. 6 to cause each signal path between any two adjacent source registers (including adjacent pipeline register circuits 51-69) to be less than or equal to the maximum signal path length. The design tool 501 uses the distances calculated in operation 403 and the maximum signal path length to determine how many pipeline register circuits to place between BIST circuit 601 and each of circuits 11-27 and where along each signal path to place the pipeline register circuits 51-69. The length of each signal path between any two adjacent source registers represents the physical distance in the IC dictated by the allowable signal transit time.

In some embodiments, the lengths of the signal paths between adjacent pairs of the pipeline register circuits 51-69 may vary by small percentages. For example, the length L1 of the signal path between pipeline register circuits 52 and 53 may be different than the length L2 of the signal path between pipeline register circuits 53 and 54, because the bus in the signal path between registers 52 and 53 is connected to only one circuit 11, but the bus in the signal path between registers 53 and 54 is connected to two circuits 12 and 13.

During test operation, BIST circuit 601 generates output test signals, including test stimuli and expected results, that are transmitted through the signal paths shown in FIG. 6 and the pipeline register circuits 51-69 to circuits 11-27. Circuits 11-27 then perform tests and generate signals indicating the test results in response to the test stimuli. The test results are provided to collar circuits or other circuitry that compares the test results to the expected results. Signals indicating whether circuits 11-27 passed or failed the tests are then generated by the collar circuits, as discussed above.

The embodiments disclosed herein may be incorporated into any suitable integrated circuit. For example, the embodiments may be incorporated into numerous types of devices such as programmable logic integrated circuits, application specific standard products (ASSPs), and application specific integrated circuits (ASICs). Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The integrated circuits described in one or more embodiments herein may be part of a data processing system that includes one or more of the following components: a processor; memory; input/output circuitry; and peripheral devices. The data processing can be used in a wide variety of applications, such as computer networking, data networking, instrumentation, video processing, digital signal processing, or any suitable other application where the advantage of using programmable or re-programmable logic is desirable. The integrated circuits can be used to perform a variety of different logic functions. For example, a programmable logic integrated circuit can be configured as a processor or controller that works in cooperation with a system processor. A programmable logic integrated circuit may also be used as an arbiter for arbitrating access to a shared resource in the data processing system. In yet another example, a programmable logic integrated circuit can be configured as an interface between a processor and one of the other components in the system.

The following examples pertain to further embodiments. Example 1 is an integrated circuit comprising: a built-in-self-test circuit that generates output test signals; a circuit tested by the built-in-self-test circuit, wherein the circuit tested by the built-in-self-test circuit generates test results in response to the output test signals during a test; pipeline register circuits coupled together to form a signal path for transmitting the output test signals from the built-in-self-test circuit to the circuit tested by the built-in-self-test circuit; and a functional circuit block in a reserved die area of the integrated circuit, wherein the signal path is routed around the reserved die area to the circuit tested by the built-in-self-test circuit, and wherein at least a subset of the pipeline register circuits are located adjacent to at least two sides of the reserved die area.

In Example 2, the integrated circuit of Example 1 can optionally further include wherein the subset of the pipeline register circuits are located adjacent to three sides of the reserved die area.

In Example 3, the integrated circuit of any one of Examples 1-2 can optionally further include wherein the built-in-self-test circuit is a memory built-in-self-test circuit, and wherein the circuit tested by the built-in-self-test circuit comprises a memory circuit.

In Example 4, the integrated circuit of any one of Examples 1-3 can optionally further include a collar circuit that is coupled to receive expected results and a compare enable signal from the built-in-self-test circuit, wherein the collar circuit is coupled to receive the test results from the circuit tested by the built-in-self-test circuit, and wherein the collar circuit compares the expected results to the test results to generate an output signal indicating if the circuit tested by the built-in-self-test circuit passed or failed the test.

In Example 5, the integrated circuit of any one of Examples 1-4 can optionally further include wherein each portion of the signal path between any two of the pipeline register circuits that are adjacent in the signal path is less than or equal to a maximum signal path length that is determined at least in part based on frequencies of the output test signals.

In Example 6, the integrated circuit of any one of Examples 1-5 can optionally further include an additional circuit tested by the built-in-self-test circuit, wherein the additional circuit tested by the built-in-self-test circuit generates additional test results in response to the output test signals during the test; and additional pipeline register circuits coupled together to form an additional signal path for transmitting the output test signals from the built-in-self-test circuit to the additional circuit tested by the built-in-self-test circuit.

Example 7 is a computer readable non-transitory medium storing executable instructions for placing pipeline register circuits between a built-in-self-test (BIST) circuit and a circuit to be tested by the BIST circuit in an integrated circuit, the executable instructions comprising: instructions executable to calculate a distance through a signal path in the integrated circuit from the BIST circuit to the circuit to be tested by the BIST circuit using a floor plan of the integrated circuit; instructions executable to select the signal path for routing output test signals generated by the BIST circuit from the BIST circuit to the circuit to be tested by the BIST circuit using the floor plan; and instructions executable to add at least one pipeline register circuit in the signal path to cause each portion of the signal path that is between two pipeline register circuits to be less than or equal to a maximum signal path length based on the distance through the signal path from the BIST circuit to the circuit to be tested by the BIST circuit.

In Example 8, the computer readable non-transitory medium of Example 7 can optionally further include wherein the instructions executable to add at least one pipeline register circuit in the signal path further comprise: instructions executable to analyze the floor plan to determine how many pipeline register circuits to place in the signal path.

In Example 9, the computer readable non-transitory medium of Example 8 can optionally further include wherein the instructions executable to add at least one pipeline register circuit in the signal path further comprise: instructions executable to analyze the floor plan to determine locations in the signal path to place the pipeline register circuits.

In Example 10, the computer readable non-transitory medium of any one of Examples 7-9 can optionally further include wherein the maximum signal path length is determined at least in part based on frequencies of the output test signals.

In Example 11, the computer readable non-transitory medium of any one of Examples 7-10 can optionally further include wherein the instructions executable to select the signal path further comprise: instructions executable to route the signal path around a reserved die area of the integrated circuit to the circuit to be tested by the BIST circuit, wherein at least a subset of the pipeline register circuits are located adjacent to at least two sides of the reserved die area, and wherein a functional circuit block is in the reserved die area.

In Example 12, the computer readable non-transitory medium of any one of Examples 7-11 can optionally further include: instructions executable to insert the BIST circuit and at least one pipeline register circuit into a register-transfer level for the integrated circuit (IC); and instructions executable to perform logic synthesis of the register-transfer level.

In Example 13, the computer readable non-transitory medium of any one of Examples 7-12 can optionally further include wherein the instructions executable to select the signal path further comprise: instructions executable to select the signal path for routing the output test signals from the BIST circuit to the circuit to be tested by the BIST circuit using placement information that includes a placement of a functional circuit block in a user design for the integrated circuit.

In Example 14, the computer readable non-transitory medium of any one of Examples 7-13 can optionally further include instructions executable to generate the floor plan of the integrated circuit that includes placement information indicating assigned locations in the integrated circuit for the BIST circuit, the circuit to be tested by the BIST circuit, and other functional circuit blocks, wherein the instructions executable to select the signal path further comprise instructions executable to select the signal path for routing the output test signals from the BIST circuit to the circuit to be tested by the BIST circuit using the placement information.

In Example 15, the computer readable non-transitory medium of any one of Examples 7-14 can optionally further include wherein the instructions executable to calculate the distance through the signal path further comprise instructions executable to calculate a distance through each of a plurality of signal paths in the integrated circuit from the BIST circuit to one of a plurality of circuits to be tested by the BIST circuit using the floor plan of the integrated circuit, and wherein the instructions executable to select the signal path further comprise instructions executable to select a subset of the plurality of signal paths for routing the output test signals from the BIST circuit to the plurality of circuits to be tested by the BIST circuit based on the distance through each of the plurality of signal paths to cause each selected one of the plurality of signal paths to route a subset of the output test signals to a respective one of the plurality of circuits to be tested by the BIST circuit.

In Example 16, the computer readable non-transitory medium of Example 15 can optionally further include wherein the instructions executable to add at least one pipeline register circuit in the signal path further comprise instructions executable to add at least one pipeline register circuit in each selected one of the plurality of signal paths to cause each portion of each selected one of the plurality of signal paths that is between two of the pipeline register circuits to be less than or equal to the maximum signal path length based on the distance through the respective one of the plurality of signal paths.

Example 17 is a method for placing pipeline register circuits between a built-in-self-test (BIST) circuit and a circuit to be tested by the BIST circuit in an integrated circuit, the method comprising: calculating a distance through a signal path in the integrated circuit from the BIST circuit to the circuit to be tested by the BIST circuit using a floor plan of the integrated circuit; selecting the signal path for routing output test signals generated by the BIST circuit from the BIST circuit to the circuit to be tested by the BIST circuit using the floor plan; and adding at least one pipeline register circuit in the signal path to cause each portion of the signal path that is between two pipeline register circuits to be less than or equal to a maximum signal path length using the distance through the signal path from the BIST circuit to the circuit to be tested by the BIST circuit.

In Example 18, the method of Example 17 can optionally further include wherein adding at least one pipeline register circuit in the signal path further comprises: analyzing the floor plan to determine how many pipeline register circuits to place in the signal path; and analyzing the floor plan to determine locations in the signal path to place the pipeline register circuits.

In Example 19, the method of any one of Examples 17-18 can optionally further include wherein selecting the signal path further comprises: routing the signal path around a reserved die area of the integrated circuit to the circuit to be tested by the BIST circuit, wherein at least a subset of the pipeline register circuits are located adjacent to at least two sides of the reserved die area, and wherein a functional circuit block is in the reserved die area.

In Example 20, the method of any one of Examples 17-19 can optionally further include wherein calculating the distance through the signal path further comprises calculating a distance through each of a plurality of signal paths in the integrated circuit from the BIST circuit to one of a plurality of circuits to be tested by the BIST circuit using the floor plan of the integrated circuit, and wherein selecting the signal path further comprises selecting a subset of the plurality of signal paths for routing the output test signals from the BIST circuit to the plurality of circuits to be tested by the BIST circuit based on the distance through each of the plurality of signal paths to cause each selected one of the plurality of signal paths to route a subset of the output test signals to a respective one of the plurality of circuits to be tested by the BIST circuit.

In Example 21, the method of Example 20 can optionally further include wherein adding at least one pipeline register circuit in the signal path further comprises adding at least one pipeline register circuit in each of the plurality of signal paths to cause each portion of each of the plurality of signal paths that is between two of the pipeline register circuits to be less than or equal to the maximum signal path length using the distance through the respective one of the plurality of signal paths.

Example 22 is an integrated circuit comprising: means for generating output test signals; means for generating test results in response to the output test signals during a test; means for forming a signal path for transmitting the output test signals from the means for generating the output test signals to the means for generating the test results; and a reserved die area of the integrated circuit, wherein the signal path is routed around the reserved die area to the means for generating the test results, and wherein at least a portion of the means for forming the signal path is located adjacent to at least two sides of the reserved die area.

In Example 23, the integrated circuit of Example 22 can optionally further include wherein the means for generating the output test signals comprises a built-in-self-test circuit, and wherein the means for generating the test results comprises a memory circuit.

In Example 24, the integrated circuit of any one of Examples 22-23 can optionally further include means for comparing expected results to the test results in response to a compare enable signal to generate an output signal indicating if the means for generating the test results passed or failed the test, wherein the means for comparing receives the expected results and the compare enable signal from the means for generating the output test signals.

In Example 25, the integrated circuit of any one of Examples 22-24 can optionally further include wherein each portion of the signal path between any two pipeline register circuits that are adjacent in the signal path is less than or equal to a maximum signal path length that is determined at least in part based on frequencies of the output test signals and set-up times of register circuits receiving the output test signals.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A computer readable non-transitory medium storing executable instructions for placing pipeline register circuits between a built-in-self-test (BIST) circuit and a circuit to be tested by the BIST circuit in an integrated circuit, the executable instructions comprising:
   instructions executable to calculate a distance through a signal path in the integrated circuit from the BIST circuit to the circuit to be tested by the BIST circuit using a floor plan of the integrated circuit;
   instructions executable to select the signal path for routing output test signals generated by the BIST circuit from the BIST circuit to the circuit to be tested by the BIST circuit using the floor plan;
   instructions executable to analyze the floor plan to determine a number of the pipeline register circuits to place in the signal path based on a maximum signal path length that is determined at least in part based on frequencies of the output test signals; and
   instructions executable to add the number of the pipeline register circuits in the signal path to cause each portion of the signal path that is between two of the pipeline register circuits to be less than or equal to the maximum signal path length based on the distance through the signal path from the BIST circuit to the circuit to be tested by the BIST circuit.

2. The computer readable non-transitory medium of claim 1, wherein the instructions executable to analyze the floor plan to determine the number of the pipeline register circuits to place in the signal path further comprise:
   instructions executable to determine the number of the pipeline register circuits to place in the signal path by dividing the distance through the signal path by the maximum signal path length.

3. The computer readable non-transitory medium of claim 2, wherein the instructions executable to add the number of the pipeline register circuits in the signal path further comprise:
   instructions executable to analyze the floor plan to determine locations in the signal path to place the pipeline register circuits.

4. The computer readable non-transitory medium of claim 1, wherein the maximum signal path length is less than one unit interval of bits transmitted through the signal path.

5. The computer readable non-transitory medium of claim 1, wherein the instructions executable to select the signal path further comprise:
   instructions executable to route the signal path around a reserved die area of the integrated circuit to the circuit to be tested by the BIST circuit, wherein at least a subset of the pipeline register circuits are located adjacent to at least two sides of the reserved die area, and wherein a functional circuit block is placed in the reserved die area.

6. The computer readable non-transitory medium of claim 1 further comprising:
   instructions executable to place the BIST circuit and the number of the pipeline register circuits into a register-transfer level for the integrated circuit; and
   instructions executable to perform logic synthesis of the register-transfer level.

7. The computer readable non-transitory medium of claim 1, wherein the instructions executable to select the signal path further comprise:
   instructions executable to select the signal path for routing the output test signals from the BIST circuit to the circuit to be tested by the BIST circuit using placement information that includes a placement of a functional circuit block in a user design for the integrated circuit.

8. The computer readable non-transitory medium of claim 1 further comprising:
   instructions executable to generate the floor plan of the integrated circuit that includes placement information indicating assigned locations in the integrated circuit for the BIST circuit, the circuit to be tested by the BIST circuit, and functional circuit blocks,
   wherein the instructions executable to select the signal path further comprise instructions executable to select the signal path for routing the output test signals from the BIST circuit to the circuit to be tested by the BIST circuit using the placement information.

9. The computer readable non-transitory medium of claim 1, wherein the instructions executable to calculate the distance through the signal path further comprise instructions executable to calculate a distance through each of a plurality of signal paths in the integrated circuit from the BIST circuit to one of a plurality of circuits to be tested by the BIST circuit using the floor plan of the integrated circuit, and
   wherein the instructions executable to select the signal path further comprise instructions executable to select a subset of the plurality of signal paths for routing the output test signals from the BIST circuit to the plurality of circuits to be tested by the BIST circuit based on the distance through each of the plurality of signal paths to cause each selected one of the plurality of signal paths to route a subset of the output test signals to a respective one of the plurality of circuits to be tested by the BIST circuit.

10. The computer readable non-transitory medium of claim 9, wherein the instructions executable to add the number of the pipeline register circuits in the signal path further comprise instructions executable to add at least one of the pipeline register circuits in each selected one of the plurality of signal paths to cause each portion of each selected one of the plurality of signal paths that is between two of the pipeline register circuits to be less than or equal to the maximum signal path length based on the distance through the respective one of the plurality of signal paths.

11. A method for placing pipeline register circuits between a built-in-self-test (BIST) circuit and a circuit to be tested by the BIST circuit in an integrated circuit, the method comprising:
   calculating a distance through a signal path in the integrated circuit from the BIST circuit to the circuit to be tested by the BIST circuit using a floor plan of the integrated circuit;
   selecting the signal path for routing output test signals generated by the BIST circuit from the BIST circuit to the circuit to be tested by the BIST circuit using the floor plan;
   analyzing the floor plan to determine a number of the pipeline register circuits to place in the signal path based on a maximum signal path length that is determined at least in part based on frequencies of the output test signals; and
   placing the number of the pipeline register circuits in the signal path to cause each portion of the signal path that is between two of the pipeline register circuits to be less than or equal to the maximum signal path length using the distance through the signal path from the BIST circuit to the circuit to be tested by the BIST circuit.

12. The method of claim 11, wherein placing the number of the pipeline register circuits in the signal path further comprises:

analyzing the floor plan to determine locations in the signal path to place the pipeline register circuits.

13. The method of claim 11, wherein selecting the signal path further comprises:
routing the signal path around a reserved die area of the integrated circuit to the circuit to be tested by the BIST circuit, wherein at least a subset of the pipeline register circuits are located adjacent to at least two sides of the reserved die area, and wherein a functional circuit block is placed in the reserved die area.

14. The method of claim 11, wherein calculating the distance through the signal path further comprises calculating a distance through each of a plurality of signal paths in the integrated circuit from the BIST circuit to one of a plurality of circuits to be tested by the BIST circuit using the floor plan of the integrated circuit, and
wherein selecting the signal path further comprises selecting a subset of the plurality of signal paths for routing the output test signals from the BIST circuit to the plurality of circuits to be tested by the BIST circuit based on the distance through each of the plurality of signal paths to cause each selected one of the plurality of signal paths to route a subset of the output test signals to a respective one of the plurality of circuits to be tested by the BIST circuit.

15. The method of claim 14, wherein placing the number of the pipeline register circuits in the signal path further comprises placing at least one of the pipeline register circuits in each selected one of the plurality of signal paths to cause each portion of each selected one of the plurality of signal paths that is between two of the pipeline register circuits to be less than or equal to the maximum signal path length based on the distance through the respective one of the plurality of signal paths.

16. The method of claim 11, wherein the maximum signal path length is less than one unit interval of bits transmitted through the signal path.

17. The method of claim 11 further comprising:
placing the BIST circuit and the number of the pipeline register circuits into a register-transfer level for the integrated circuit; and
performing logic synthesis of the register-transfer level.

18. The method of claim 11, wherein selecting the signal path for routing the output test signals further comprises:
selecting the signal path for routing the output test signals from the BIST circuit to the circuit to be tested by the BIST circuit using placement information that includes a placement of a functional circuit block in a user design for the integrated circuit.

19. The method of claim 11 further comprising:
generating the floor plan of the integrated circuit that includes placement information indicating assigned locations in the integrated circuit for the BIST circuit, the circuit to be tested by the BIST circuit, and functional circuit blocks.

20. The method of claim 19, wherein selecting the signal path for routing the output test signals further comprises selecting the signal path for routing the output test signals from the BIST circuit to the circuit to be tested by the BIST circuit using the placement information.

21. The method of claim 11, wherein the integrated circuit is a programmable logic integrated circuit.

\* \* \* \* \*